US006178654B1

United States Patent
Kanatake

(10) Patent No.: US 6,178,654 B1
(45) Date of Patent: Jan. 30, 2001

(54) METHOD AND SYSTEM FOR ALIGNING SPHERICAL-SHAPED OBJECTS

(75) Inventor: Takashi Kanatake, Tokorozawa (JP)

(73) Assignee: Ball Semiconductor, Inc., Allen, TX (US)

(*) Notice: Under 35 U.S.C. 154(b), the term of this patent shall be extended for 0 days.

(21) Appl. No.: 09/252,139

(22) Filed: Feb. 18, 1999

(51) Int. Cl.[7] .............................. H01L 29/06; H05K 7/02; G01B 21/22; G01D 21/00
(52) U.S. Cl. .................................. 33/645; 33/644; 257/618
(58) Field of Search ............................... 33/644, 645, 533, 33/545, 613, 567, 655, 549, 573, DIG. 2, 503; 257/618, 531, 532, 536, 1

(56) References Cited

U.S. PATENT DOCUMENTS

| 4,239,332 | * | 12/1980 | Inbar | 385/22 |
|---|---|---|---|---|
| 4,635,373 | * | 1/1987 | Miyazaki et al. | 33/573 |
| 5,456,018 | * | 10/1995 | Irlbeck | 33/645 |
| 5,556,808 | * | 9/1996 | Williams et al. | 437/209 |
| 5,848,477 | * | 12/1998 | Wiedmann et al. | 33/503 |
| 5,877,943 | * | 3/1999 | Ramamurthi | 257/618 |
| 5,945,725 | * | 8/1999 | Ishikawa | 257/531 |
| 5,955,776 | * | 9/1999 | Ishikawa | 257/618 |

* cited by examiner

Primary Examiner—Christopher W. Fulton
Assistant Examiner—Yaritza Guadalupe
(74) Attorney, Agent, or Firm—Haynes and Boone, LLP

(57) ABSTRACT

A system and method for holding and aligning spherical shaped devices is disclosed. The system aligns spherical shaped devices that have at least two hollows formed on an outer surface thereof. The system includes a first knob for aligning with the first hollow and a second knob for aligning with the second hollow. The first knob is relatively small, as compared with the first hollow, while the second knob is relatively large, as compared with the second hollow. The system may also include a third knob for securing the spherical shaped device with the first and second knobs.

19 Claims, 4 Drawing Sheets

METHOD AND SYSTEM FOR ALIGNING SPHERICAL-SHAPED OBJECTS

BACKGROUND OF THE INVENTION

The invention relates generally to alignment systems for spherical-shaped objects, and more particularly, to a method and system for aligning and handling spherical-shaped objects suitable for use in the manufacture and transport of spherical-shaped semiconductor integrated circuits.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, because the wafers are round and the completed chips are rectangular, the peripheral portion of each wafer cannot be used.

Another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas. Therefore, due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,955,776 (Ishikawa), assigned to the same assignee as the present application and hereby incorporated by reference as if reproduced in its entirety, a method and system for manufacturing spherical-shaped semiconductor integrated circuits is disclosed. As disclosed in the aforementioned patent application, the manufacturing process by which a spherical-shaped semiconductor integrated circuit is produced may include a variety of processing steps. Among these are: deposition of films, and photolithography.

Complicating the manufacturing process for spherical-shaped semiconductor integrated circuits are the special handling requirements which must be afforded the circuits during their manufacture. Unlike conventional integrated circuits formed from flat surface semiconductor wafers, the spherical-shaped semiconductor integrated circuits produced from spherical-shaped semiconductors consume the entire surface area of the spherical-shaped semiconductors. Also, unlike conventional integrated circuits which may be grasped along bottom or side surfaces thereof, grasping or otherwise contacting spherical-shaped semiconductor during the manufacturing process may result in significant damage thereto. Furthermore, many of the processing techniques used to manufacture conventional integrated circuits are unsuitable for use in the manufacture of spherical-shaped semiconductor integrated circuits.

Further complicating the manufacturing process for spherical-shaped semiconductor integrated circuits is the ability to align each device, such as is required in photolithographic processes. Unlike conventional semiconductor wafers that can be placed on a chuck and aligned with alignment marks thereon inscribed, the spherical-shaped semiconductor integrated circuit devices can move and roll on a chuck. Also, unlike conventional semiconductor devices that can have their entire surface exposed to a single alignment camera, the spherical-shaped semiconductor integrated circuit devices typically conceal at least one-half of its surface area from an alignment camera.

Therefore, the difficulties associated with the handling and alignment of spherical-shaped semiconductor integrated circuits during the manufacturing process remains an obstacle to the development of such devices.

While the contactless capture of spherical objects using a diverging nozzle has been disclosed in U.S. Pat. No. 6,048,011 (Ser. No. 09/162,616) to Fruhling et al., aligning the spherical shaped object has not yet been achieved. The nozzle disclosed in Fruhling et al. may be used, however, in some capacity to facilitate alignment.

Thus, there remains a need for a system and method capable of readily capturing, holding and aligning spherical-shaped objects.

SUMMARY OF THE INVENTION

In one embodiment, the present invention provides a system and method for holding and aligning spherical shaped devices. The system aligns spherical shaped devices that have at least two hollows formed on an outer surface thereof. The system includes a first knob for aligning with the first hollow and a second knob for aligning with the second hollow. The first knob is relatively small, as compared with the first hollow, while the second knob is relatively large, as compared with the second hollow. The system may also include a third knob for securing the spherical shaped device with the first and second knobs.

In some embodiments, the system also includes an ultrasonic vibrator. The ultrasonic vibrator is capable of vibrating one or more of the three knobs. If a spherical shaped device is on the three knobs, it is levitated by the vibrations and moves. This levitation and movement facilitates the alignment of the device to the knobs.

In some embodiments, once the spherical shaped device is aligned to the knobs, processing operations may be performed on the device. For example, a photolithographic process, which requires a very fine alignment, may be performed. The photolithographic process may utilize a multi-site mirror placed near the aligned spherical shaped device. The multi-site mirror allows images to be projected on a portion of the device's outer surface.

In some embodiments, the system simultaneously aligns a plurality of the spherical shaped devices. The system includes a plurality of receptacles, each receptacle including three knobs as described above for receiving a corresponding spherical shaped device. Each of the receptacles is vibrated by the ultrasonic vibrator to levitate and move the corresponding devices on top of the receptacle, thereby facilitating the alignment of each device to its receptacle.

DESCRIPTION OF THE EMBODIMENTS

Figure 1:
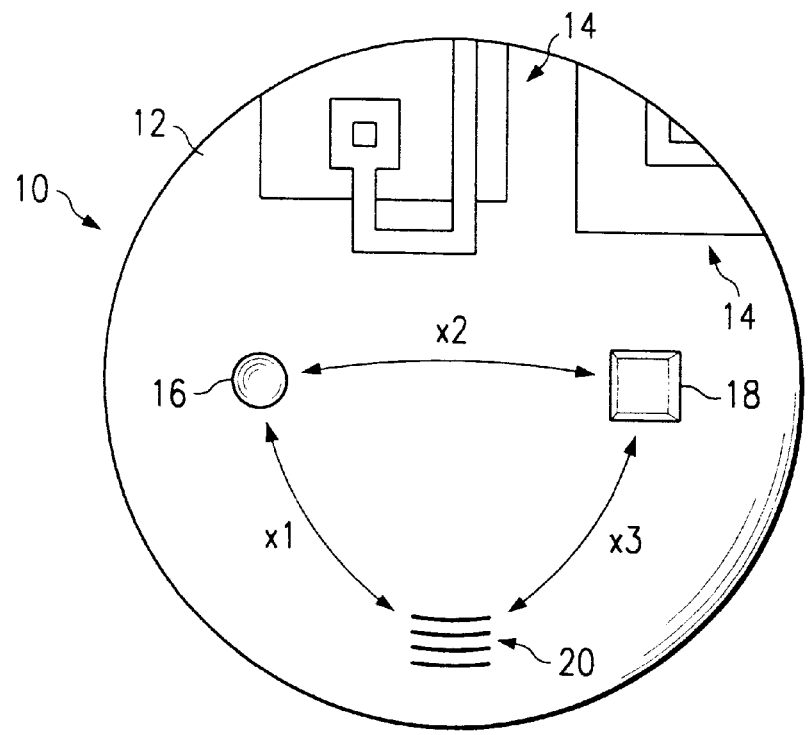
FIG. 1 is a diagram of a spherical shaped semiconductor integrated circuit device for being aligned by the present invention.

Referring to FIG. 1, the reference numeral 10 refers, in general, to a spherical shaped semiconductor integrated circuit device (hereinafter "sphere"). The sphere 10 is one that may, for example, be produced according to presently incorporated U.S. patent application Ser. No. 08/858,004. On an outer surface 12 of the sphere 10 are a plurality of circuit components 14. The present invention may be used for processing the circuit components 14 onto the sphere 10 so in some instances there may be no actual circuit components, while in other instances there may be circuit component covering a large portion of the outer surface 12.

Figure 4:
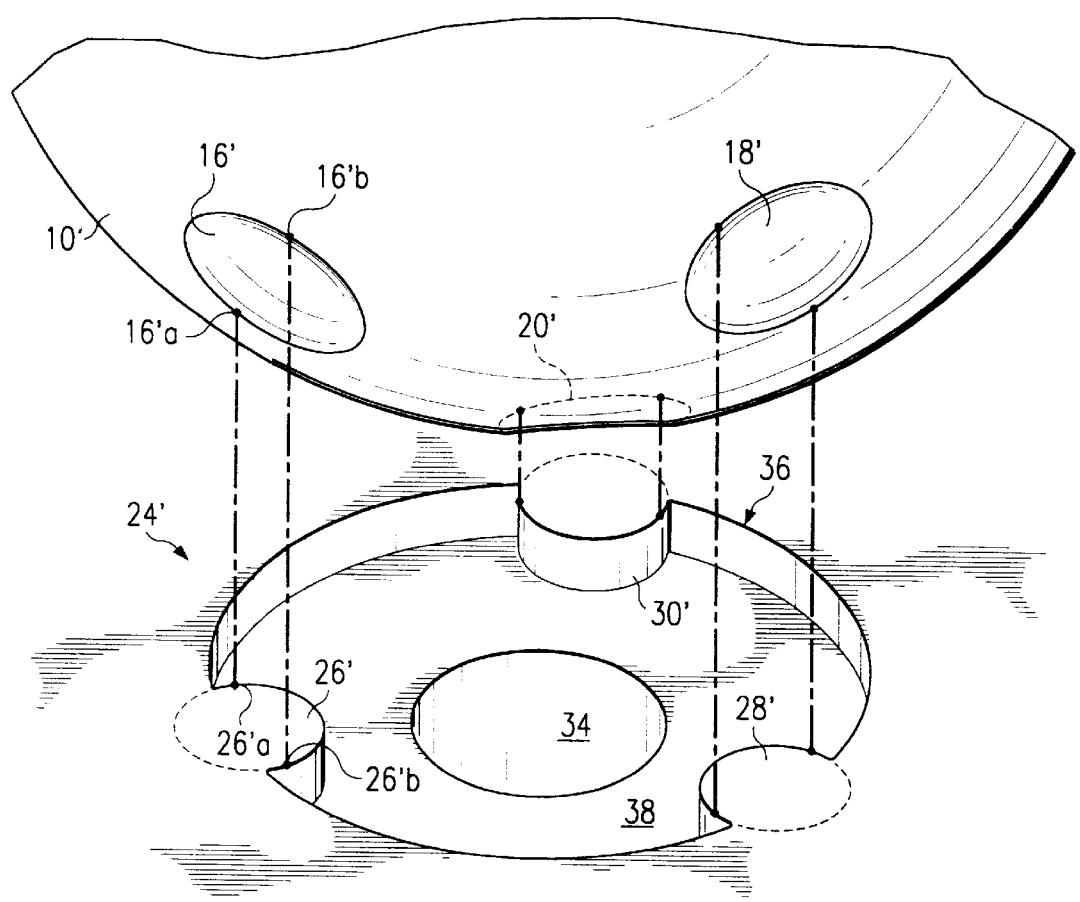
FIG. 4 is an enlarged view of another embodiment of a receptacle for aligning a spherical shaped semiconductor integrated circuit device.

Also on the outer surface 12 are two hollows 16, 18 and a resting point 20. In some embodiments, the resting point 20 may also be a hollow and the two hollows 16, 18 (or three hollows 16–20) may be of different shapes and sizes. For the sake of example, the hollow 16 is illustrated as a relatively-small circular-shaped recess and the hollow 18 is illustrated as a larger, square-shaped recess. In other embodiments, the hollows 16, 18 may be triangular, conical, or cylindrical shaped, such as is shown in FIG. 4, below. The resting point 20 in the present embodiment, is not recessed like the hollows 16, 18. Instead, it merely represents a contact point on the outer surface 12. Other embodiments of the resting point 20 may provide one or more indentions to facilitate alignment.

In the preferred embodiment, no circuit components 14 are formed at the two hollows 16, 18 or the resting point 20. However, it is understood that this is merely a choice of design. Also, in the preferred embodiment, the two hollows 16, 18 and resting point 20 are spaced at distances according to Table 1, below. For the sake of reference, the distances are flat distances, in that they do not consider the curvature of the surface 12.

TABLE 1

| DISTANCE | CONNECTING NODES |
| --- | --- |
| x1 | hollow 16, point 20 |
| x2 | hollow 16, hollow 18 |
| x3 | hollow 18, point 20 |

In the preferred embodiment, the distances are unequal, according to the equation:

$$x1 \neq x2 \neq x3.$$

It is understood, however, that different distances will provide different advantages. For example, larger distances provide a more-stable support for the sphere 10 while smaller distances are easier to align (as discussed in greater detail below). Also, by having unequal distances, improper alignments can be reduced.

Figure 2:
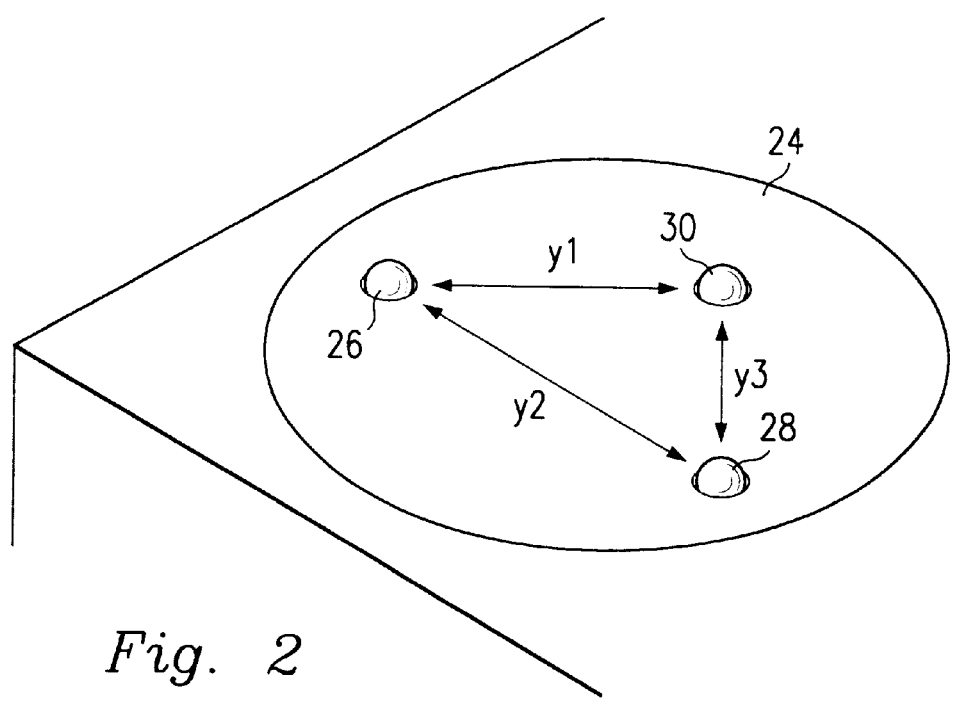
FIG. 2 is one embodiment of a receptacle for aligning the spherical shaped semiconductor integrated circuit device of FIG. 1.

Referring also to FIG. 2, it is desired to place the sphere 10 on top of a receptacle 24 for stabilizing the sphere and positioning it for further processing. When the sphere 10 is placed onto the receptacle 24 the hollow 16 will align with an alignment knob 26 the hollow 18 will align with an alignment knob 28 and the resting point 20 will align with an alignment knob 30. Although each of the an alignment knobs 26–30 are shown to be of the same basic shape, it is understood that different shapes may also be used to facilitate the different shapes of the hollows 16, 18 and the resting point 20. For example, the knobs 26–30 may alternatively be triangular, conical, or cylindrical. In the preferred embodiment, the alignment knobs 26–30 are spaced at distances according to Table 2, below.

TABLE 2

| DISTANCE | CONNECTING NODES |
| --- | --- |
| y1 | knobs 26, 30 |
| y2 | knobs 26, 28 |
| y3 | knobs 28, 30 |

In the preferred embodiment, the corresponding distances are equal, according to the equations:

$$x1=y1;$$

$$x2=y2;$$

$$x3=y3.$$

However, it is understood that different embodiments may have the corresponding distances offset so that a tighter alignment can be achieved, as discussed in greater detail, below.

Figure 3:
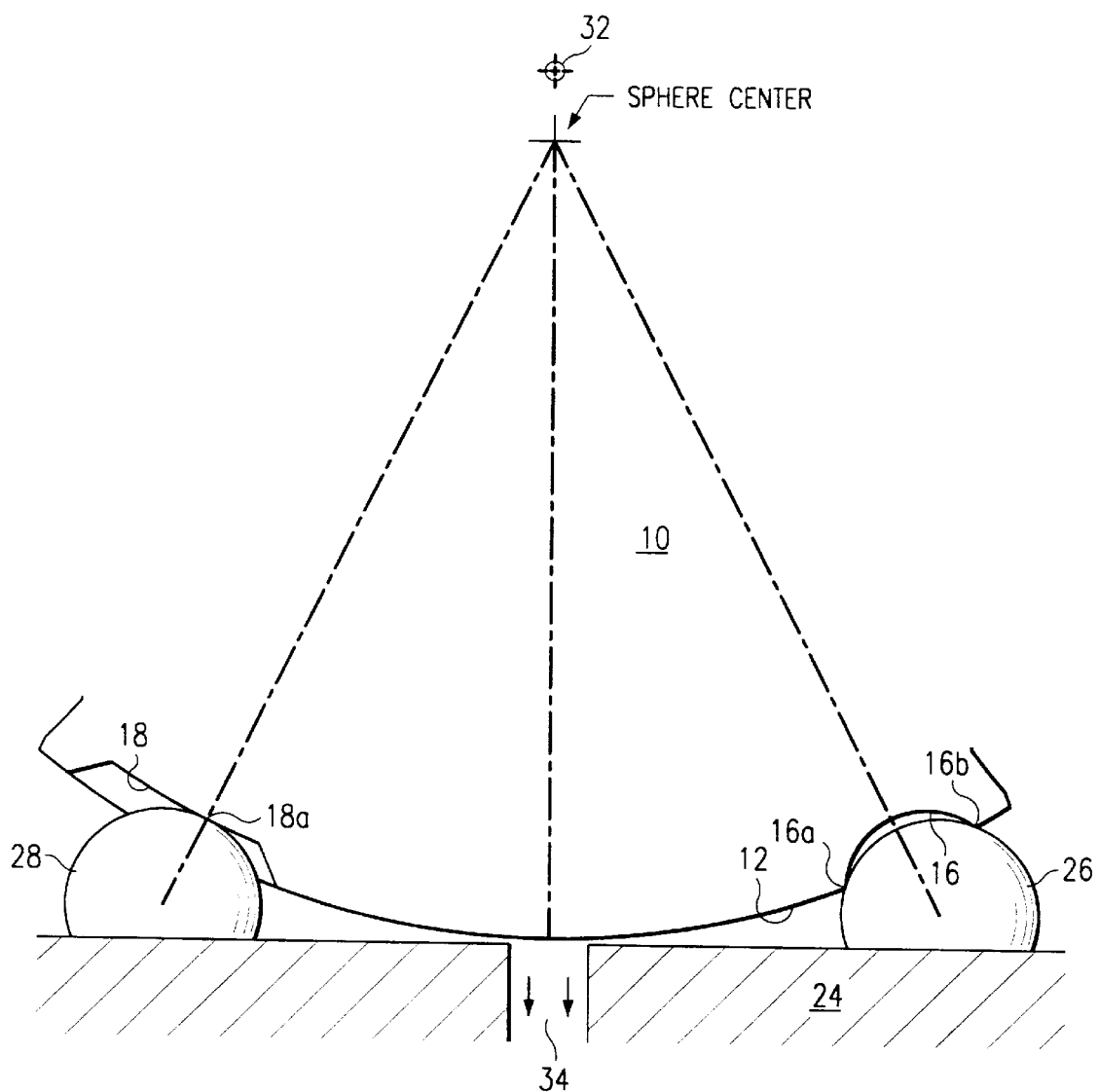
FIG. 3 is an enlarged cross-sectional view of the receptacle of FIG. 2 and the spherical shaped semiconductor integrated circuit device of FIG. 1 in an aligned position.

Referring also to FIG. 3, when the sphere 10 is resting on the receptacle 24 the hollows 16, 18 align with the knobs 26, 28 respectively. Although not shown, the resting point 20 also aligns with the knob 30. As can be seen from the drawing, however, the alignment between hollow 16 and knob 26 is different than the alignment between hollow 18 and knob 28.

The size and shape of the hollow 18 is relatively large, as compared with the size and shape of the knob 28. As a result, the sphere 10 is rough-aligned by the knob 28 contacting the hollow 18 at a single contact point 18*a*. The contact point 18*a* is located in an interior portion of the hollow 18.

The size and shape of the hollow 16 is relatively small, as compared with the size and shape of the knob 26. As a result, the sphere 10 is fine-aligned by the knob 26 contacting the hollow 16 in a ring-like shape. FIG. 3, being two-dimensional, illustrates this ring-like contact with contact points 16*a* and 16*b*. The contact points 16*a*, 16*b* (and hence the entire ring of contact points) are located at an edge of the hollow 16 where it is formed on the surface 12 of the sphere 10.

The knobs 28–30 and hollows/resting points 16–20 may align sequentially. First the knob 30 aligns with the contact point 20. Then the knob 28 rough-aligns with the hollow 18. Finally, the knob 16 fine-aligns with the hollow 26. The sequential alignment of the knobs 28–30 and hollows/resting points 16–20 is discussed in greater detail below. When all of the knobs 28–30 are properly aligned with the hollows/resting points 16–20, respectively, then a center of gravity 32 of the sphere 10 is securely positioned between the three knobs and over the receptacle 24.

In some embodiments, the receptacle 24 may include an aperture 34 for providing a negative (or vacuum) pressure to the sphere 10. This vacuum pressure may be used during the alignment process of the sphere 10, as discussed below, and/or may be used to secure the sphere to the receptacle 24 once alignment has been achieved.

Referring to FIG. 4, in another embodiment, the sphere (now designated as the sphere 10') includes three hollows 16', 18', and 20'. For the sake of example, the hollows 16', 18', 20' are illustrated as relatively-small circular-shaped recesses having a diameter of about 60 microns. Unlike the sphere 10 of FIG. 1, the distances between the hollows 16', 18', 20' are identical.

Another embodiment of the receptacle (designated as the receptacle 24') can be used with the sphere 10'. The receptacle 24' includes a knob pattern 36 formed, for example, from a single extruded piece of material. The knob pattern 36 include three "partial" pins 26', 28', 30'. Each of the pins are similar in their partially-circular shape in that a portion of the circle that makes up each pin is integrated into the receptacle 24'. Also, the pins 26', 28', 30' are relatively large, and for the sake of example, have a diameter of about 120 microns. It is understood, however, that alternative shapes may also be used for the pins 26'–30', and in some instances, the pins may have shapes that are different from each other. The center of the knob pattern 36 includes a recessed area 38 for receiving a portion of the sphere 10'. The recessed area 38 may also include the aperture 34 for providing a negative (or vacuum) pressure to the sphere 10'.

It is desired to place the sphere 10' on top of a receptacle 24' for stabilizing the sphere and positioning it for further processing. When the sphere 10' is placed onto the receptacle 24', the hollow 16' will align with an pin 26', the hollow 18' will align with an pin 28', and the hollow 20' will align with an pin 30'. When the sphere 10' is resting on the receptacle 24', the hollows 16', 18', 20' will each contact the pins 26', 28', 30', respectively, at exactly two contact points. For example, two points 16'*a*, 16'*b* on the perimeter of hollow 16' will contact with two points 26'*a*, 26'*b* on the perimeter of pin 26'. When all of the pins 26', 28', 30 are properly aligned with the hollows 16', 18', 20', respectively, then the center of gravity of the sphere 10' is securely positioned between the three pins and over the receptacle 24' and the sphere 10' is finely aligned.

Figure 5A:
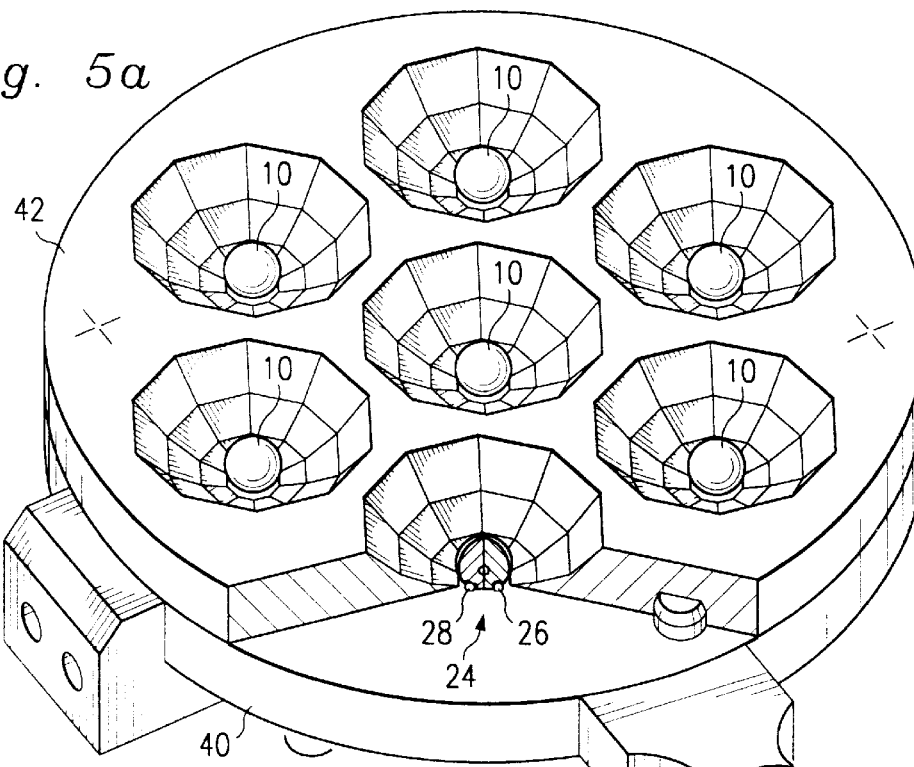
FIGS. 5a–5b are exemplary processing devices using a plurality of the receptacles for performing photolithography on a plurality of the spherical shaped semiconductor integrated circuit devices.
Figure 5B:
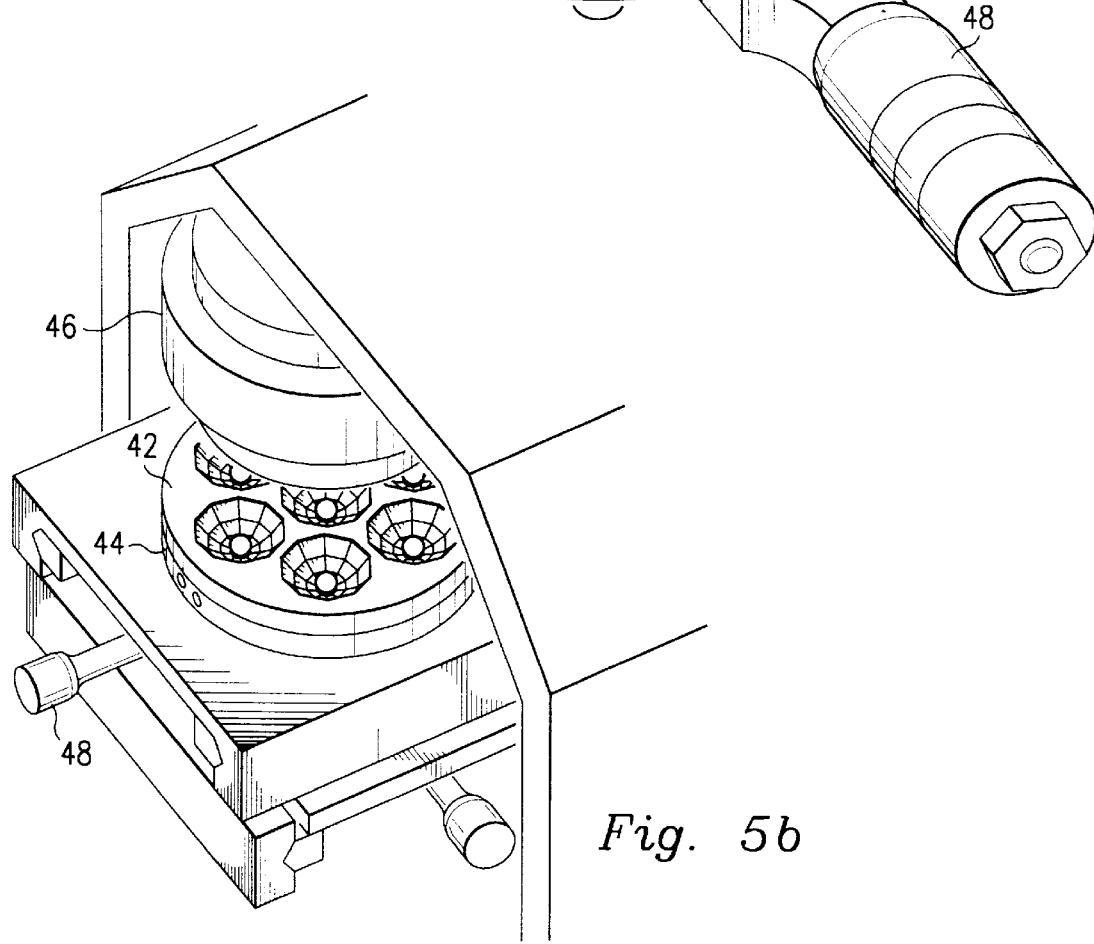

Referring to FIGS. 5*a*–5*b*, in one embodiment, a plurality of receptacles are arranged on a processing plate 50. For the sake of example, the receptacles are similar to those discussed with reference to FIG. 2, above. The processing plate 50 can thereby receive a plurality of spheres 10 and simultaneously process each sphere. For example, a multi-site mirror plate 52 may include a plurality of multi-mirror exposer systems 55 such as is described in U.S. Pat. Ser. No. 60/092,295 filed Jul. 10, 1998, assigned to the same assignee as the present application and hereby incorporated by reference as if reproduced in its entirety. The multi-mirror exposure systems 55 may be used for directing photolithographic images from a lens 56 to process the spheres 10, as described in the above-identified patent (application).

In one embodiment, the processing plate 50 is attached to a vibrator 58. The vibrator 58 is capable of providing ultrasonic vibration to the processing plate 50.

In operation, one or more spheres 10 are placed on each receptacle in a very rough alignment position. Although not shown, such rough alignment may use a diverging nozzle, such as is disclosed in U.S. Pat. No. (Ser. No. 09/162,616), along with a plurality of cameras. Alternatively, each sphere 10 may be vibrated against a rail before it is placed on the receptacle 25. The offset center of gravity 32 can arrange the spheres 10 so that a very rough and inverted alignment will occur. With this rough, inverted alignment, the spheres 10 can be rotated, or the receptacle 25 can be rotated, to provide a rough, non-inverted alignment In yet another alternative, oppositely charged electrostatic charges may be applied to the hollows 16, 18 and the knobs 26, 28. In this way, the electrical attraction between the opposite charges may facilitate a very rough alignment.

It is understood that this step may occur with or without the multi-site mirror plate 52 in place over the processing plate 50. In some embodiments, the multi-site mirror plate 52 may be connected directly to the multi-site lens 56.

With the spheres 10 in a very-rough alignment position, the vibrator 58 is activated. The ultrasonic vibration of the processing plate 50 serves to levitate and move each of the spheres 10. The ultrasonic vibration also causes very little friction between the knobs 26–30 and the outer surface 12 of the spheres 10.

As the spheres 10 move, the hollow 18 aligns with the knob 28. This is still a rough alignment, although much more precise than when the spheres 10 were first placed on the processing plate 50. Once the hollow 18 and knob 28 align, further vibration causes the hollow 16 and the knob 26 to align. Due to the unique shapes of the hollow 16 and the knob 26 this provides a very fine alignment of the spheres 10. Any or all of the above alignment steps may be enhanced with the vacuum pressure from the aperture 35. Also, the vacuum pressure may secure each aligned sphere 10 while the remaining spheres are still being aligned. Once all the spheres 10 have been fine-aligned, photolithography may be performed on the spheres.

Thus, there has been described and illustrated herein, a method and apparatus for aligning spherical-shaped objects spherical-shaped objects. It should be clearly understood, however, that various modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for aligning a spherical shaped device having at least two hollows, the method comprising the steps of:

aligning a first knob with the first hollow, wherein the first knob is relatively small, as compared with the first hollow;

aligning a second knob with the second hollow, wherein the second knob is relatively large, as compared with the second hollow; and providing a third knob to secure the spherical shaped device with the first and second knobs, whereby the spherical-shaped device is aligned by the first and second knobs and is secured by the third knob.

2. The method of claim 1 wherein the steps of aligning utilize a vibrator to vibrate the first and second knobs.

3. The method of claim 2 wherein vibrator is ultrasonic and the spherical shaped device is levitated and moved by ultrasonic vibrations.

4. The method of claim 1 further comprising:

providing a vacuum pressure to encourage the spherical shaped device towards the three knobs.

5. The method of claim 1 wherein the first knob contacts the first hollow at one contact point.

6. The method of claim 5 wherein the second knob contacts the second hollow at a plurality of contact points.

7. The method of claim 1 wherein the spherical shaped device includes a portion of an integrated circuit on its outer surface.

8. The method of claim 7 further comprising the step of:

performing a photolithographic exposure on the aligned spherical shaped device.

9. The method of claim 8 further comprising the step of:

placing a multi-mirror near the aligned spherical shaped device for facilitating the photolithographic exposure of the device.

10. The method of claim 1 further comprising the step of:

placing the spherical shaped device on the three knobs before the steps of aligning.

11. The system of claim 10 further comprising:

a vibrator for vibrating at least one of the three knobs.

12. The system of claim 11 wherein the vibrator is ultrasonic and the spherical shaped device is levitated and moved by ultrasonic vibrations of the vibrated knobs.

13. A system for aligning a spherical shaped device having at least two hollows, the system comprising:

a first knob for aligning with the first hollow, the first knob being relatively small as compared with the first hollow;

a second knob for aligning with the second hollow, the second knob being relatively large, as compared with the second hollow; and a third knob for securing the spherical shaped device with the first and second knobs, whereby the spherical-shaped device is aligned by the first and second knobs and is secured by the third knob.

14. The system of claim 13 further comprising:

a vacuum for providing pressure to encourage the spherical shaped device towards the three knobs.

15. The system of claim 13 wherein the first knob contacts the first hollow at relatively few contact points.

16. The system of claim 15 wherein the second knob contacts the second hollow at many contact points.

17. The system of claim 13 wherein the spherical shaped device includes a portion of an integrated circuit on its outer surface.

18. The system of claim 13 further comprising:

means for performing photolithography on the aligned spherical shaped device.

19. The system of claim 13 further comprising:

means for placing the spherical shaped device on the three knobs before the steps of aligning.

* * * * *